United States Patent
Köhler

(10) Patent No.: US 12,429,541 B2
(45) Date of Patent: Sep. 30, 2025

(54) MEASUREMENT OF A GRADIENT FIELD IN AN MRT SYSTEM

(71) Applicant: Siemens Healthineers AG, Forchheim (DE)

(72) Inventor: Michael Köhler, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 260 days.

(21) Appl. No.: 18/127,644

(22) Filed: Mar. 28, 2023

(65) Prior Publication Data

US 2023/0314539 A1 Oct. 5, 2023

(30) Foreign Application Priority Data

Mar. 29, 2022 (EP) ..................................... 22164891

(51) Int. Cl.
*G01R 33/385* (2006.01)

(52) U.S. Cl.
CPC .................................. *G01R 33/385* (2013.01)

(58) Field of Classification Search
CPC .................................................. G01R 33/385
See application file for complete search history.

(56) References Cited

U.S. PATENT DOCUMENTS

| | | |
|---|---|---|
| 4,748,409 A | 5/1988 | Frahm et al. |
| 5,451,877 A | 9/1995 | Weissenberger |
| 6,335,620 B1 * | 1/2002 | Weissenberger ............................ G01R 33/56518 324/309 |
| 7,002,343 B2 | 2/2006 | Weissenberger |
| 9,046,590 B2 * | 6/2015 | Umeda ............ G01R 33/56518 |
| 10,042,019 B2 * | 8/2018 | Grodzki ............. G01R 33/3607 |
| 2016/0091582 A1 | 3/2016 | Thompson et al. |

FOREIGN PATENT DOCUMENTS

| | | |
|---|---|---|
| EP | 0184840 A1 | 6/1986 |
| EP | 0386822 A2 | 9/1990 |
| WO | 2013002232 A1 | 1/2013 |

OTHER PUBLICATIONS

Machine Translation of WO2013-002232A1 (Year: 2013).*

(Continued)

*Primary Examiner* — Gregory H Curran
(74) *Attorney, Agent, or Firm* — Lempia Summerfield Katz LLC

(57) ABSTRACT

In a method for measuring a gradient field in a magnetic resonance tomography (MRT) system, a first slice is excited by a first radio frequency (RF) pulse being emitted and by a first slice selection gradient being switched at least partly at the same time as the first RF pulse. A second slice is excited by a second RF pulse being emitted and by a second slice selection gradient being switched at least partly at the same time as the second RF pulse. The second slice intersects with the first slice in an intersection region. After the excitation of the second slice, a readout gradient is switched, and an MR signal emitted from the intersection region is acquired. Depending on the MR signal, a disruption variable is computed, which determines a deviation of a temporal course of an amplitude of the readout gradient from a predetermined required course.

17 Claims, 4 Drawing Sheets

(56) References Cited

OTHER PUBLICATIONS

Atkinson, I. C. et al; "Characterization and Correction of System Delays and Eddy Currents for MRI Imaging with Ultrashort Echo-Time and Time-Varying Gradients"; Magnetic Resonance in Medicine; vol. 62; pp. 532-537; 2009.

Barmet, C. et al.; "A third-order field camera with microsecond resolution for MR system diagnostics", 2009, Proc. Intl. Soc. Mag. Reson. Med., vol. 17, pp. 781.

Barmet, Christoph et al.; "Spatiotemporal Magnetic Field Monitoring for MR"; Magnetic Resonance in Medicine, vol. 60, pp. 187-197, 2008.

Bernstein, Matt A. et al. "Handbook of MRI Pulse Sequences", Elsevier, 2004; ISBN-13:978-0-12-092861-3, Chapter 13.2.; 16 pp.

Ma, C. et al.; "A new eddy-current compensation method in MRI."; PIERS online vol. 3, No. 6; 2007, pp. 874-878.

Zhao X. et al.; "Impact of gradient imperfections on bone water quantification with UTE MRI." Magnetic resonance in medicine vol. 84(4); 2020; pp. 2034-2047.

\* cited by examiner

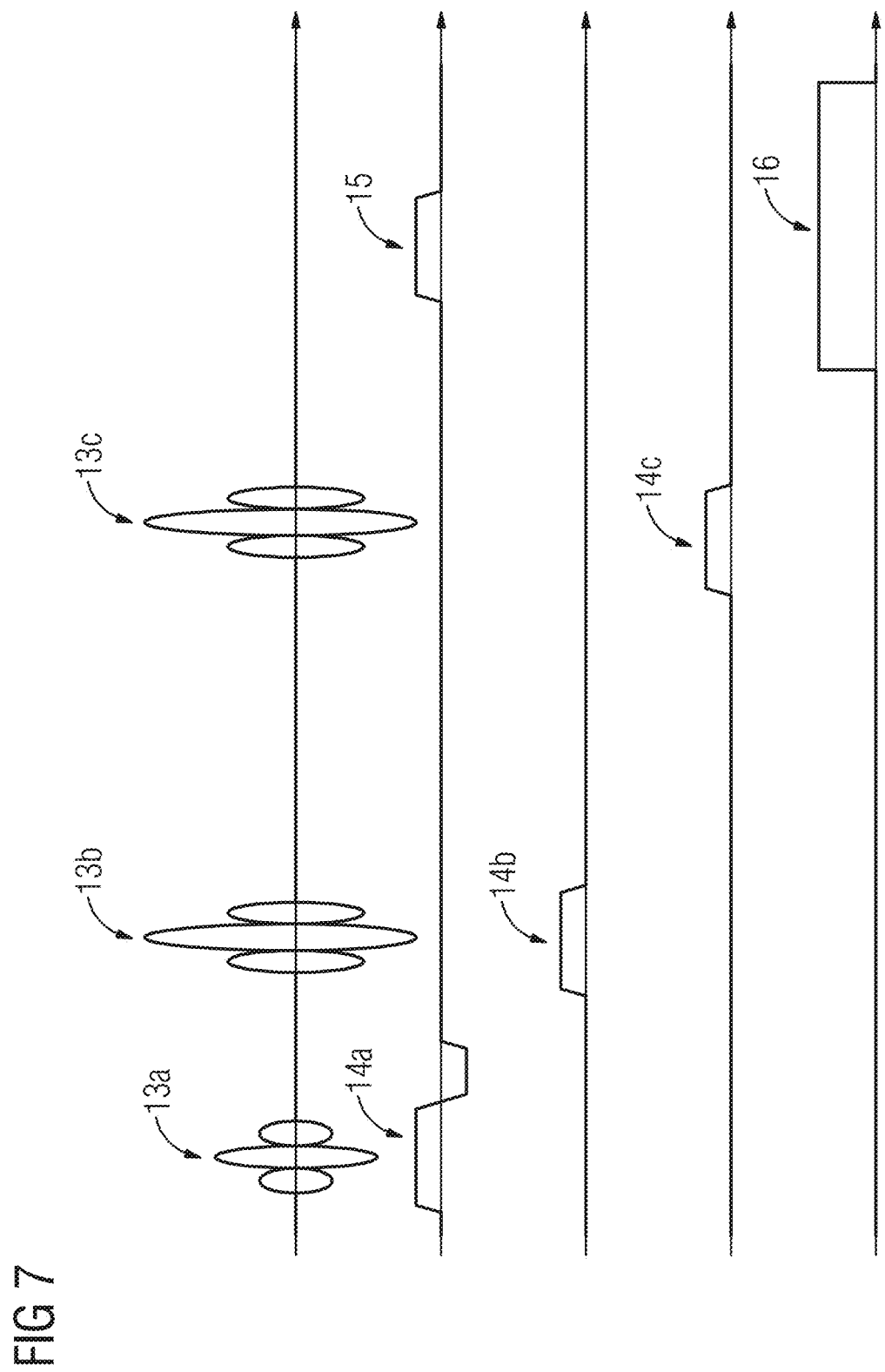

MEASUREMENT OF A GRADIENT FIELD IN AN MRT SYSTEM

This application claims the benefit of European Patent Application No. EP 22 164 891.8, filed on Mar. 29, 2022, which is hereby incorporated by reference in its entirety.

BACKGROUND

The present embodiments relate to methods for measurement of a gradient field in an imaging region of a magnetic resonance tomography (MRT) system, and to a corresponding MRT system.

Apparatuses for Magnetic Resonance Tomography (MRT) are imaging apparatuses that use a strong external magnetic field in order to align the nuclear spins of an object to be examined and, by application of an RF excitation pulse, excite the nuclear spins to precess around the corresponding alignment. The precession or the transition of the spins from this excited state into a state with lower energy generates an electromagnetic alternating field as a response, which may be detected via receive antennas as an MR signal.

With the aid of magnetic gradient fields, a position encoding may be impressed onto the signals, which subsequently allows the signal received to be assigned to a volume element of the examination object. The received signal may then be evaluated in order, for example, to provide a graphical representation of the examination object.

Deviations of the temporal course of the gradient fields, also referred to as gradient trajectories, from corresponding required specifications, may be caused by eddy currents, non-linearities, controller deviations of a gradient amplifier, or other transmission effects (e.g., filter characteristics of the hardware used). Especially relevant are eddy currents, which may lead to a location-dependent influencing of the gradient fields generated. Eddy currents with relatively short time constants, roughly in the region of a few ms and or less, are especially relevant.

The spatial encoding during MR imaging may be influenced by the deviations or imperfections of the temporal course of the gradient fields, for example. The falsifications of the readout gradients may, for example, lead to artifacts, since the intended gradient trajectory is not realized precisely, and the recorded data is thereby sorted incorrectly into the k-space. Depending on the sequence technique used, various artifacts may arise thereby.

These effects are relevant with MR sequences, for example, that use readout gradients with variable amplitude and/or polarity for the recording of rows in the k-space. Inter alia, this includes Echo Planar Imaging (EPI) sequences, spiral imaging, measurements with sinusoidal readout gradients, or radial recording techniques.

Typical resulting artifacts are Nyquist ghosting or N/2 ghosting in EPI measurements. This is attributable to different polarities of the readout gradients being used in EPI for different k-space rows. The aforementioned deviations of the actual gradient shape from the intended shape lead to the rows in the k-space that are recorded with positive gradient polarity now experiencing a different disruption (e.g., by shifting of the echoes or accumulated phases) to the rows measured with negative polarity in the k-space experience.

Further, the problem is especially relevant for measurements with data acquisition during ramp sampling. In order to apply usual FFT techniques for transformation of the k-space data into the image space, the data that is recorded during the ramp sampling and thus corresponds to a non-equidistant k-space sampling may be initially converted into equidistant points in the k-space. This process is also referred to as gridding or re-gridding. For correct classification of the data into the k-space in this case, the knowledge of the temporal course of the output readout gradients is important. The deviations mentioned may lead to an incorrect gridding, which may cause artifacts, such as "ringing" in the readout direction and "ghosting" during EPI measurement with ramp sampling. The latter relates above all to a type of ghosting, in which edges of the object appear as an especially strong ghost.

Eddy currents may bring about different spatial distributions of field disruptions. The eddy currents may, for example, be divided into B0-like eddy currents that create a spatially constant field disruption, linear or gradient-like eddy currents that create a gradient-like field disruption, which essentially has the same spatial course as the gradient that created it, cross terms, and eddy currents of higher spatial order. Cross terms that, however, have a course that runs orthogonally to the gradient that creates the cross terms (e.g., when a gradient in the X direction creates an eddy current that leads to a field that runs linearly in the Y direction) create a gradient-like field disruption. Eddy currents of higher spatial order create field disruptions of which the course depends on more than one spatial coordinate or on a power of a coordinate.

All these types of eddy current may cause the aforementioned problems. This may be countered, for example, by an "eddy current compensation" (ECC) by pre-emphasis in the output of gradient pulses, such as described, for example, in document U.S. Pat. No. 5,451,877 A. Further, it is possible to take account retrospectively of the deviation of the gradient fields during gridding.

In both cases, however, it is necessary to measure the deviation of the temporal course of the gradient fields. Document US 2016/0091582 A1 describes a method in which the temporal fluctuations of the magnetic field in an MRT volume are determined based on the rise in a phase difference between the spin responses in a number of slices. These are stored and used for more exact re-gridding of the acquired k-space data before the image reconstruction.

A disadvantage in this case is that, through inherent averagings, field disruptions of a higher spatial order are not mapped or are not mapped completely.

In order to counteract this, special sensors that are also referred to as field probes or field cameras may be employed in order to determine the field distribution in a three-dimensionally resolved manner. Such approaches, however, usually require a complicated calibration of the system independent of clinical measurements, and also, their integration into the data collection and data provision is time-consuming.

SUMMARY AND DESCRIPTION

The scope of the present invention is defined solely by the appended claims and is not affected to any degree by the statements within this summary.

The present embodiments may obviate one or more of the drawbacks or limitations in the related art. For example, space disruption influences, such as disruption fields that influence a temporal course of gradient fields, are determined more precisely. During magnetic resonance imaging, disruptions of a higher spatial order may be determined more precisely.

The present embodiments are based on the idea of exciting two slices different from one another and intersecting each other in a test object, switching a readout gradient thereafter, and acquiring a magnetic resonance (MR) signal emitted from a corresponding intersection region of the slices. Depending on the MR signal, a disruption variable is computed. The disruption variable determines a deviation of a temporal course of an amplitude of the readout gradient from a predetermined required course.

In accordance with one aspect of the present embodiments, a method for measuring a gradient field in an imaging region of a magnetic resonance tomography (MRT) system is specified. In this method, a first slice in a test object, which is located in the imaging region, is excited (e.g., by a radio frequency (RF) transmit coil arrangement and a gradient coil arrangement of the MRT system, which are controlled by at least one control unit of the MRT system in order to excite the first slice). After the exciting of the first slice, a second slice in the test object is excited (e.g., by the gradient coil arrangement and the RF transmit coil arrangement activated by the at least one control unit). The second slice intersects with the first slice within the test object in an intersection region. After the excitation of the second slice, a readout gradient that may also be referred to as a test gradient is switched (e.g., by the gradient coil arrangement activated by the at least one control unit), and an MR signal emitted from the intersection region is acquired (e.g., by a signal acquisition apparatus of the MRT system). Depending on the MR signal, a disruption variable is computed (e.g., by a computing unit of the MRT system). The disruption variable determines a deviation of a temporal course of an amplitude of the readout gradient from a predetermined required course for the readout gradient (e.g., for the amplitude of the readout gradient).

The terms of a gradient (e.g., of a readout gradient) of a slice selection gradient and so forth, and of a gradient field are used here and below in the usual way in the context of MR imaging. For switching of a gradient (e.g., of the readout gradient), thus, for example, a corresponding spatially variable magnetic field is created using the gradient coil arrangement. The change in the amplitude of the magnetic field as a function of the spatial coordinates then corresponds to a gradient or gradient field in the meaning used. A temporal course of the amplitude of the gradient or of a number of amplitudes of gradients in different directions may also be referred to as the gradient trajectory.

The test object, depending on the form of embodiment of the method, may involve an object to be imaged (e.g., a patient) who is to be imaged during MRT imaging, which, for example, may follow the method for measuring of the gradient field of the present embodiments. The test object may, however, also involve a phantom object that is employed, for example, during calibration or during tune-up of an MRT system.

The switching of a gradient (e.g., of the readout gradient) may be time-dependent activation and deactivation or control of the gradient coil arrangement in order to create a corresponding temporal course of the gradient field. A gradient in this case may also be a gradient pulse with one or more parts, which are also referred to as lobes.

The first slice and the second slice are different from one another and not parallel to one another, so that the first slice and the second slice intersect with one another within the test object. Each slice involves an approximately three-dimensional spatial region with a constant thickness, which is also referred to as the slice thickness. Accordingly, a volume region in which the first slice and the second slice intersect, apart from deviations through the shape of the test object, is approximately given by a three-dimensional volume in the form of a column. If the first slice and the second slice are at right angles to one another, then the column has an approximately rectangular or square cross section.

The intersection region may correspond to the entire column or to a part thereof. For example, it is possible in different forms of embodiment of the method, for just the first slice and the second slice to be excited, but no other slice, however. Then, the intersection region corresponds to the entire column (e.g., the entire volume region in which the first slice and the second slice intersect). It is, however, also possible for a third slice that intersects both with the first slice and also the second slice to be excited. In this case, the intersection region may involve a part of the column. When the first slice, the second slice, and the third slice are each at right angles to one another, a square-shaped or cube-shaped part of the column is involved, for example.

The intersection region thus always involves a volume region that is contained in all excited slices involved. Accordingly, the MR signal is also emitted from the intersection region. In other words, what is achieved by the excitation of the first slice and of the second slice and also optionally the third slice is that, on switching of the readout gradient and/or after the switching of the readout gradient, the MR signal that is emitted from the intersection region is acquired.

The MR signal involves a signal as a result of a resonant spin response of the excited nuclear spins in the intersection region. Depending on the form of embodiment of the method, this may involve a spin echo or a so-called stimulated echo. For example, the MR signal involves a spin echo when just the first slice and the second slice are excited, but not the third slice, whereas the MR signal involves a stimulated echo when the first slice, the second slice, and the third slice are excited.

The acquisition of the MR signal, for example, includes the creation of corresponding MR data or MR test data dependent on the MR signal. To this end, the MR signal may be detected, for example, by one or more antennas or receive coils of the signal acquisition apparatus and be converted by receive electronics of the signal acquisition apparatus into the MR test data. The receive electronics, for example, include an Analog-to-Digital Converter (ADC). To this end, the acquisition electronics (e.g., the ADC) may be activated, for example, while the readout gradient is being switched and/or after the readout gradient has been switched.

The required course of the amplitude of the readout gradient corresponds to the temporal course of the amplitude of the readout gradient theoretically to be expected under ideal conditions (e.g., when there is no disruption), such as eddy currents or the like, present. The required course may, for example, be given by a temporal course of the current and/or a control signal for activation of the gradient coil apparatus for switching of the readout gradient or vice versa.

For example, the readout gradient is switched in accordance with the predetermined required course or depending on the predetermined required course.

The disruption variable is, for example, a function of the time and may also be referred to as the disruption function. The disruption variable may directly correspond to the deviation of the temporal course of the amplitude from the predetermined required course. As an alternative, the deviation of the temporal course of the amplitude from the required course may be computed explicitly from the disruption variable and where necessary from further known information.

The disruption variable is, for example, independent of the readout gradient and the required course. This has the advantage that the disruption variable, once determined or computed, may also be used for computing a deviation of a further readout gradient, slice selection gradient, or further gradient, from a corresponding further required course. The determination of the disruption variable may thus be understood as a kind of disruption calibration. The disruption variable in this case quantifies the influence of disruption effects, such as eddy currents, on the creation of the readout gradient and its actual gradient trajectory. The disruption variable, however, also quantifies the influence of the disruption effects on other gradient trajectories. The disruption variable may therefore be determined once and then be stored for further use.

The fact that both the first slice and also the second slice are excited before the readout gradient is switched and the MR signal is accordingly emitted not from the entire first slice and not from the entire second slice, but just from the intersection region, provides that the disruption variable represents the disruption influences in the intersection region and not the disruption influences averaged over the first or second slice. This thus allows a spatially-resolved measurement of the gradient field and thus of the disruption variable to be achieved, which is not just restricted to a resolution in one slice selection direction, but also in a further direction. As a result, the disruption variable is thus able to be quantified with an increased spatial resolution and accordingly more accurately.

In accordance with at least one form of embodiment of the method, the disruption variable is computed as a variable independent of the required course.

The disruption variable is thus, for example, computed as a time-dependent function e(t), where e(t) does not depend either on the temporal course of the readout gradients or on the required course, but merely on the disruption influences themselves. This may be achieved, for example, by a corresponding model description being chosen for the disruption influences and being reconciled with the measurements (e.g., the MR test data) that are computed based on the acquired MR signal. Since the physical interrelationships such as an eddy current or another disruption that may influence the readout gradients are known per se, with the knowledge of the required course from the measured MR test data, the independent disruption variable e(t) may thus be computed.

The disruption variable may then be stored (e.g., on a memory medium of the MRT system) and be used for further uses (e.g., in a method for magnetic resonance imaging following on from the method for measuring the gradient field). The disruption variable may in this case, for example, be taken into account within the framework of the eddy current compensation mentioned at the outset and/or during gridding in order to avoid artifacts.

The independence of the disruption variable from the required course, for example, has the advantage that then, in the MR imaging, any given other gradients with other required courses may be used, which may still be corrected with the aid of the disruption variable.

In accordance with at least one form of embodiment, the first slice is excited by a first RF pulse being emitted into the imaging region and by a first slice selection gradient being switched at least partly at the same time as the first RF pulse.

RF in this case stands for radio frequency and is used here and below with the meaning usually used in the context of MR imaging. The frequency of RF pulses lies in the order of magnitude of the Larmor frequency of the nuclear spins to be excited (e.g., depending on the size of the basic magnetic field, in the region of 10 MHz through to several 100 MHz).

The fact that the first slice selection gradient is switched at least partly at the same time as the first RF pulse may, for example, be understood such that the first RF pulse and the first slice selection gradient overlap with each other in time. For example, a period of time during which the first RF pulse is emitted may lie entirely within a period of time in which the first slice selection gradient is switched.

In accordance with at least one form of embodiment, the second slice is excited by a second RF pulse being emitted in the imaging region and a second slice selection gradient being switched at least partly at the same time as the second RF pulse.

The first slice and the second slice selection gradient point in this case in different directions, so that the first slice and the second slice correspondingly intersect in the test object.

In accordance with at least one form of embodiment, a first flip angle resulting from the first RF pulse lies in the interval [60°, 120°] (e.g., in the interval [80°, 100°]). For example, the first flip angle is equal to 90° or approximately equal to 90°.

In other words, the first RF pulse may be interpreted as an excitation pulse that accordingly leads to precession of the nuclear spins.

Both the signal of a spin echo and also the signal of a stimulated echo is at its maximum with respect to the first flip angle when the angle is equal to 90°. The signal disappears, for example, with a first flip angle of 0°. Accordingly, the intervals are linked to an especially large signal.

In accordance with at least one form of embodiment, a first slice in the test object is excited (e.g., by a further first RF pulse being emitted in the imaging region and a further first slice selection gradient being switched at least partly at the same time as the further first RF pulse). After the excitation of the further first slice, a further second slice is excited in the test object (e.g., by a further second RF pulse being emitted in the imaging region and a further second slice selection gradient being switched at least partly at the same time as the further second RF pulse). The further second slice intersects with the further first slice in this case within the test object in a further intersection region. After the excitation of the further second slice, depending on the required course, a further readout gradient is switched, and a further MR signal emitted from the further intersection region is acquired. The disruption variable is computed depending on the MR signal and the further MR signal (e.g., by the computing unit).

As regards the switching of the further first slice selection gradient and further second slice selection gradient and also of the further readout gradient, as regards the emission of the further first RF pulse and of the further second RF pulse and as regards the acquisition of the further MR signal, what has been stated above about the first slice selection gradient, second slice selection gradient, first RF pulse, second RF pulse, readout gradients, and MR signal is referred to. These are correspondingly able to be transmitted in a similar way (e.g., in relation to the use of the gradient coil arrangement, the RF transmit coil apparatus, and the signal acquisition apparatus).

The excitation of the first further slice and of the second further slice and the corresponding acquisition of the further MR signal may precede or follow the excitation of the first slice and of the second slice or the acquisition of the MR signal in time. The parameters for measurement may be the same. For example, the flip angles employed are where possible as identical as possible to the RF pulses and also to the shape of the slice selection gradient.

For example, the predetermined required course is both a required course for the readout gradients and also for the further readout gradients. In other words, under ideal conditions or nominally, the shape of the readout gradients is the same as the shape of the further readout gradients.

For example, the further readout gradient is switched in accordance with predetermined required course or depending on the predetermined required course.

In many forms of embodiment, the first further slice is different than the first slice and different than the second slice, and the second further slice is different than the first slice and the second slice. In some forms of embodiment, the first slice is the same as the first further slice, and the second slice is different from the second further slice. In further forms of embodiment, the first slice is different than the first further slice, and the second slice is the same as the second further slice.

In an embodiment, the first slice is the same as the first further slice, and the second slice is parallel to the second further slice. In one embodiment, the first slice is at right angles to the second slice in this case.

In a further form of embodiment, the first slice is parallel to the first further slice, and the second slice is the same as the second further slice. In one embodiment, the first slice is at right angles to the second slice.

In that the further MR signal is taken into account as well as the MR signal for computation of the disruption variable, spatial variations of the disruption influences may be extracted (e.g., by a phase comparison of the MR signal with the further MR signal).

In accordance with at least one form of embodiment, the disruption variable is computed depending on a phase difference between the MR signal and the further MR signal.

In accordance with at least one form of embodiment, the disruption variable is computed as a time-dependent function e(t) based on the relationship $$\dot{\phi}(t)/(2\pi d\gamma)=G_s(t)-\int_0^t e(\tau)\dot{G}_s(\tau)d\tau, \quad (1)$$

where t refers to the time, $G_s$ refers to the required course, $\dot{G}_s$ refers to the first temporal derivative of the required course, $\dot{\phi}$ refers to the first temporal derivative of the phase difference, $\gamma$ refers to the gyromagnetic ratio, and d refers to a spatial distance between the intersection region and the further intersection region.

In forms of embodiment, in which the first slice and the first further slice are the same, and the second slice is parallel to the second further slice, d corresponds to the spatial distance between the second slice and the second further slice. In forms of embodiment, in which the second and the second further slice are the same, and the first slice is parallel to the first further slice, d corresponds to the spatial distance between the first slice and the first further slice.

In order to compute the disruption variable based on the above relationship, a fit method, for example, or any other balancing computation may thus be carried out in order to find a function e(t) that best or optimally reproduces the above relationship for a given required course and measured phase difference.

The relationship of the equation (1) therefore, for example, rests on the readout gradient being proportional to the temporal derivative of the phase difference and by the required course corrected by a convolution of the disruption variable being able to be represented by the temporal derivative of the required course.

In accordance with at least one form of embodiment, an approach is selected for the disruption variable in accordance with which the disruption variable is defined by a plurality of parameters independent of one another, and respective values are computed for the plurality of independent parameters by a fit method.

The approach being chosen for the disruption variable may, for example, be understood such that it is assumed that the disruption variable is able to be expressed approximately by a mathematical expression (e.g., a mathematical function of the time). The approach may, for example, include the disruption variable being described as an exponential function or as the sum of such exponential functions. For example, the following approach may be used:

$$e(t)=\Sigma_{i=1}^{N}A_i e^{-t/\tau_i}. \quad (2)$$

In this, $A_i$ refers to the amplitudes, and $\tau_i$ refers to the (e.g., positive) time constants of individual eddy current amounts to the disruption variable e(t). N is further a predetermined natural number (e.g., greater than or equal to 1).

The plurality of the parameters independent of one another then corresponds to $A_i$ and $\tau_i$. Through the fit method, for example, optimal values for $A_i$ and $\tau_i$ are determined (e.g., by the measured phase difference, the predetermined required course, and the approach e(t) being set in the above relationship of the equation (1)).

The fit method may, for example, include choosing various values for the plurality of parameters independently of one another and evaluating how well the above relationship is fulfilled. The plurality of independent parameters is then varied in order to achieve a match with the relationship that is as good as possible.

The fit method may, for example, include a balancing computation, a parameter estimation, or a regression computation.

In accordance with at least one form of embodiment, the further first slice is the same as the first slice and the further second slice is parallel to the second slice, but, for example, not identical to the second slice, however.

If, for example, it is assumed that the first slice and the further first slice define a specific region in the X direction and the second slice and the further second slice each define different regions in the Y direction at right angles to the X direction, then the phase difference in such forms of embodiment corresponds to a phase difference in the Y direction with a constant X value. If the readout gradient, for example, is a gradient in the X direction, then the disruption variable may, for example, correspond to a cross term of the X gradient in Y direction. If the readout gradient is a gradient in the Y direction, then the disruption variable may represent gradient-like interferences in the Y direction.

In accordance with at least one form of embodiment, the further second slice is the same as the second slice, and the further first slice is parallel to the first slice, but, for example, not identical to the first slice, however.

In accordance with at least one form of embodiment, after the excitation of the second slice and before the switching of the readout gradient, a third slice is excited in the test object, where the third slice, the second slice, and the first slice intersect with one another in the intersection region.

The third slice is, for example, excited by a third RF pulse being emitted in the imaging region and a third slice selection gradient being switched at least partly at the same time as the third RF pulse.

In this case, the MR signal is thus, for example, attributable to a stimulated echo. Through the excitation of the third slice, the intersection region is narrowed down further (e.g., in three directions that are given by the first slice, second slice, and third slice).

In forms of embodiment, the first slice, the second slice, and the third slice are each at right angles to one another in pairs. In such forms of embodiment, the intersection region is thus given by a square-shaped or cube-shaped volume region. This allows the spatial resolution of the measurement of the gradient field or the determination of the disruption variable to be further enhanced.

In accordance with at least one form of embodiment, after the excitation of the further second slice and before the switching of the further readout gradient, a further third slice is excited in the test object, where the further third slice, the further second slice, and the further first slice intersect with one another in the intersection region.

In accordance with at least one form of embodiment, the third slice is at right angles to the first slice, and the third slice is at right angles to the second slice.

In accordance with at least one form of embodiment, the further third slice is parallel to the third slice.

In accordance with at least one form of embodiment, a second flip angle resulting from the second RF pulse lies in the interval [60°, 120°] (e.g., in the interval [80°, 100°]), or the second flip angle is equal to 90°.

In one embodiment, a third flip angle resulting from the third RF pulse lies in the interval [60°, 120°] (e.g., in the interval [80°, 100°]), or the third flip angle is equal to 90°.

Such forms of embodiment are, for example, advantageous when the third slice is excited and, for example, the further third slice is excited; thus, the MR signal or the further MR signal involves a signal attributable to a stimulated echo.

The maximum amplitude of the stimulated echo is both proportional to the sine of the second flip angle and also to the sine of the third flip angle. The strongest resonance response of the stimulated echo is thus produced with respect to the first flip angle and of the second flip angle when these are both equal to 90°. The intervals referred to likewise still deliver good results.

The maximum amplitude of the stimulated echo is also proportional to the sine of the first flip angle. The optimum resonance response is thus produced overall when the first flip angle, the second flip angle, and the third flip angle are each equal to 90°.

In accordance with at least one form of embodiment, the second flip angle lies in the interval [150°, 210°] (e.g., in the interval [170°, 190°]), or the second flip angle is equal to 180°.

Such forms of embodiment are, for example, advantageous when the third slice is not excited and, for example, the further third slice is not excited; the MR signal or the further MR signal is thus attributable to a spin echo.

The maximum amplitude of the spin echo is proportional to the sine of half of the second flip angle. Further, the maximum amplitude of the spin echo is proportional to the sine of the first flip angle. Accordingly, a second flip angle of 180° is optimal (e.g., in combination with a first flip angle of 90°).

In accordance with a further aspect of the present embodiments, a method for Magnetic Resonance Tomography (MRT) using an MRT system is also provided. In this aspect, a method for measuring a gradient field in an imaging region of the MRT system in accordance with the present embodiments is carried out. At least one MR image (e.g., thus, a local space image) is created (e.g., by a computing unit of the MRT system) depending on the disruption variable.

For example, MR data is created by the MRT system in the imaging region, and the MR image is created depending on the MR data and the disruption variable. The MR data represents an object that may be the same as the test object or may be different than the test object.

The creation of the MR data may be undertaken in a known way in this case. The disruption variable may then, for example, be used during image reconstruction for image correction (e.g., for phase correction in the case of EPI measurements), or during re-gridding of the MR data.

In such forms of embodiment, the MR data is thus created independently of the disruption variable, and the disruption variable is taken into account together with the MR data only for creation of the MR image.

In alternate forms of embodiment, the MR data is created by the MRT system. For creation of the MR data, at least one gradient pulse is switched depending on the disruption variable, and the MR image is created as a function of the MR data.

In such forms of embodiment, the disruption variable is thus already taken into account during creation of the gradient pulse, which, for example, may likewise be a readout gradient.

For example, a further required course for the gradient pulse may be corrected depending on the disruption variable, and the at least one gradient pulse may be switched as a function of the corrected required course.

It is further also possible for the taking into account of the disruption variable during switching of the gradient pulse to be combined in retrospect with the taking into account of the disruption variable during creation of the MR image.

In accordance with a further aspect of the present embodiments, an MRT system is specified. The MRT system has an imaging region, an RF transmit coil arrangement, and a gradient coil arrangement. The imaging region is surrounded by the RF transmit coil arrangement and the gradient coil arrangement. The MRT system has a signal acquisition apparatus and at least one control unit that is configured to activate the RF transmit coil arrangement and the gradient coil arrangement in order to excite a first slice in a test object that is located in the imaging region. In this case, the at least one control unit is, for example, configured to activate the RF transmit coil arrangement to emit a first RF pulse into the imaging region, and to activate the gradient coil arrangement to switch, at least partly at the same time as the first RF pulse, first slice selection gradients in order to excite the first slice. The at least one control unit is configured to activate the RF transmit coil arrangement and the gradient coil arrangement in order, after the excitation of the first slice, to excite a second slice in the test object. The second slice intersects with the first slice (e.g., within the test object) in an intersection region. In this case, the at least one control unit is, for example, configured to activate the RF transmit coil arrangement to emit a second RF pulse into the imaging region and to activate the gradient coil arrangement to switch a second slice selection gradient, at least partly at the same time as the second RF pulse, in order to excite the second slice. The at least one control unit is configured to activate the gradient coil arrangement, after the excitation of the second slice, to switch a readout gradient and to activate the signal acquisition apparatus to acquire an MR signal emitted from the intersection region. The MRT system has a computing unit that is configured, depending on the MR signal, to compute a disruption variable that determines a deviation of a temporal course of an amplitude of the readout gradient from a predetermined required course.

The signal acquisition apparatus in this case, for example, includes at least one receive coil and receive electronics that, for example, have an ADC and/or or receive control unit. The RF transmit coil arrangement, for example, has at least one transmit coil. In this case, in many embodiments, the at least one receive coil may correspond partly or entirely to the at least one transmit coil.

Further forms of embodiment of the MRT system directly follow the various embodiments of the method and vice versa. For example, individual features and corresponding explanations with regard to the different forms of embodiment for the method may be transferred by analogy to the corresponding forms of embodiment of the MRT system. For example, the MRT system is configured or programmed to carry out a method of the present embodiments. For example, the MRT system of the present embodiments carries out the method of the present embodiments.

In accordance with a further aspect of the present embodiments, a computer program with commands is specified. When the commands are executed by an MRT system of the present embodiments, the commands cause the MRT system to carry out a method of the present embodiments for measuring a gradient field and/or a method for MRT of the present embodiments.

In accordance with a further aspect of the present embodiments, a computer-readable memory medium (e.g., a non-transitory computer-readable storage medium) is specified. The non-transitory computer-readable storage medium stores a computer program of the present embodiments.

A computing unit may, for example, be understood as a data processing device that contains a processing circuit. The computing unit may thus, for example, process data for carrying out computing operations. Where necessary, this also includes operations for carrying out indexed accesses to a data structure (e.g., a Look-Up Table (LUT)). Also, a control unit may therefore represent or contain a computing unit or be part of a computing unit.

The computing unit may, for example, contain one or more computers, one or more microcontrollers, and/or one or more integrated circuits (e.g., one or more Application-Specific Integrated Circuits (ASIC), one or more Field Programmable Gate Arrays (FPGA), or one or more systems on a ship). The computing unit may also contain one or more processors (e.g., one or more microprocessors, one or more Central Processing Units (CPU), one or more Graphics Processing Units (GPU), and/or one or more signal processors, such as one or more digital signal processors (DSPs)). The computing unit may also contain a physical or a virtual network of computers or other of the units.

In various embodiments, the computing unit includes one or more hardware and/or software interfaces and/or one or more memory units.

A memory unit may be embodied as a volatile data memory (e.g., as a Dynamic Random Access Memory (DRAM) or Static Random Access Memory (SRAM) or as a non-volatile data memory, such as a Read-Only Memory (ROM), as a Programmable Read-Only Memory (PROM), as an Erasable Programmable Read-Only Memory (EPROM), as an Electrically Erasable Programmable Read-Only Memory (EEPROM), as a flash memory or flash EEPROM, as Ferroelectric Random Access Memory (FRAM), as a Magnetoresistive Random Access Memory (MRAM), or as Phase-Change Random Access Memory (PCRAM)).

If, within the framework of the present disclosure, reference is made to a component of the MRT system, especially the computing unit, the at least one control unit or the signal acquisition apparatus of the MRT system, being configured, embodied, designed, or the like to carry out or realize a specific function, achieve a particular effect, or serve a particular purpose, this may be understood such that the component, above and beyond the principle or theoretical usability or suitability of the component for this function, effect, or this purpose, through a corresponding adaptation, programming, physical embodiment, and so forth, is in a position in concrete terms and actually to carry out or to realize the function, to achieve the effect, or to serve the purpose.

Further features of the present embodiments emerge from the claims, the figures, and the description of the figures. The features and combinations of features given above in the description, as well as the features and combinations of features given below in the description of the figures and/or in the figures, may be included in the invention not only in the specified combination in each case, but also in other combinations of the invention. For example, versions and combinations of features may be included in the present embodiments that do not have all the features of an originally formulated claim. Above and beyond this, versions and combinations of features may be included in the invention that go beyond the combinations of features set out in the references of the claims or that deviate therefrom.

The invention will be explained in greater detail below with the aid of concrete exemplary embodiments and associated schematic diagrams. In the figures, the same elements or elements with the same function are provided with the same reference character. The description of the same elements or elements with the same function may possibly not necessarily be repeated with regard to different figures.

BRIEF DESCRIPTION OF THE DRAWINGS

FIG. 7 shows schematically an MR pulse diagram in accordance with a further embodiment of a method for measuring a gradient field.

DETAILED DESCRIPTION

Figure 1:
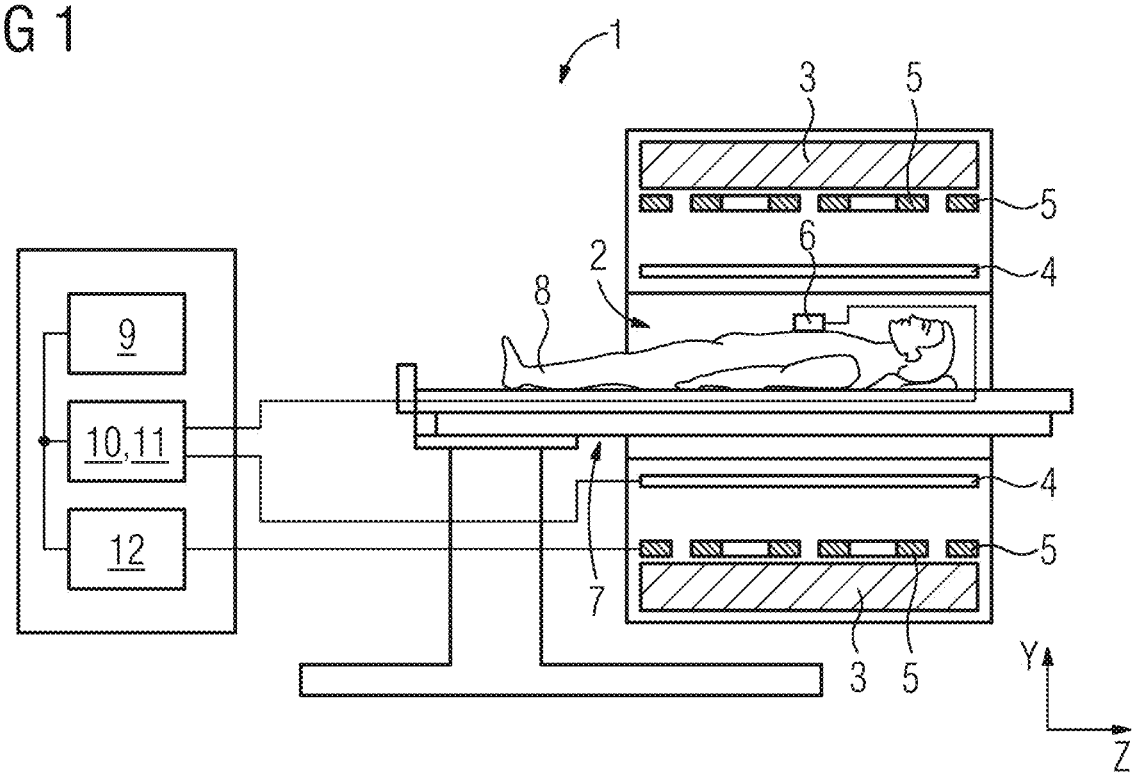
FIG. 1 shows a schematic diagram of an embodiment of a magnetic resonance tomography (MRT) system.

FIG. 1 shows a schematic diagram of an example of a form of embodiment of a magnetic resonance tomography (MRT) system 1.

The MRT system 1 includes a magnet unit with a field magnet 3 that creates a static magnetic field for alignment of nuclear spins of an object 8 (e.g., of a patient) in an imaging region. The imaging region is characterized by an extremely homogeneous static magnetic field, where the homogeneity relates, for example, to the magnetic field strength or to its amplitude. The imaging region is located in a patient tunnel 2 that extends in a longitudinal direction Z through the magnet unit. The field magnet 3 may, for example, be a superconducting magnet that may create magnetic fields with a magnetic flux density of up to 3 T or more. However, for lower field strengths, permanent magnets or electromagnets with normally conducting coils may also be used. A patient table 7 may be movable within the patient tunnel 2.

The magnet unit further includes a gradient coil arrangement 5 with a number of gradient coils that serve to superimpose gradient fields (e.g., location-dependent magnetic fields) on the static magnetic field in the three spatial directions for spatial differentiation of the sampled image areas in the imaging region. The gradient coils of the gradient coil arrangement 5 may be configured, for example, as coils of normally conducting wires that, for example, may create fields or field gradients orthogonal to one another in the imaging region.

The magnet unit includes a transmit coil arrangement that, for example, may include a body coil 4 as transmit antenna that is configured to radiate a radio-frequency signal into the imaging region. The body coil 4 may therefore be understood as an RF transmit coil arrangement of the MRT system 1 or as part of the RF transmit coil arrangement. In a few forms of embodiment, the body coil 4 may also be used to receive resonant MR signals that are sent out by the object 8. In this case, the body coil 4 may also be considered to be part of the signal acquisition apparatus of the MRT system 1. Optionally, the signal acquisition apparatus includes a local coil 6 that may be arranged in the immediate vicinity of the object 8 (e.g., on the object 8 or in the patient table 7). The local coil 6 may serve, as an alternative to or in addition to the body coil 4, as a receive coil or receive antenna.

The MRT system 1 also includes a control and computing system. The control and computing system may include a receive control unit 10 that may be seen as part of the signal acquisition apparatus and is linked to the body coil 4 and/or the local coil 6. Depending on the acquired MR signals, the receive control unit 10, which may include an Analog-to-Digital Converter (ADC), may create corresponding MR data (e.g., in the k-space). A computing unit 9 of the control and computing system may evaluate the MR data and carry out an image reconstruction, for example.

The control and computing system includes a transmit control unit 11 that is linked to the body coil 4 and controls the coil for creation of RF pulses, such as excitation pulses and/or refocusing pulses. The control and computing system includes a gradient control unit 12 that is linked to the gradient coil arrangement 5 and controls the unit in order to switch slice selection gradients, gradients for frequency, and/or phase encoding and/or readout gradients.

The described structure of the control and computing systems just represents an unrestricted example. The various tasks and functions required may also be distributed in another way and/or to different control units and/or other computing units.

The MRT system 1 is, for example, capable of carrying out a method for MRT in accordance with the present embodiments, which, for example, includes a method of the present embodiments for measuring a gradient field in the imaging region.

Figure 4:
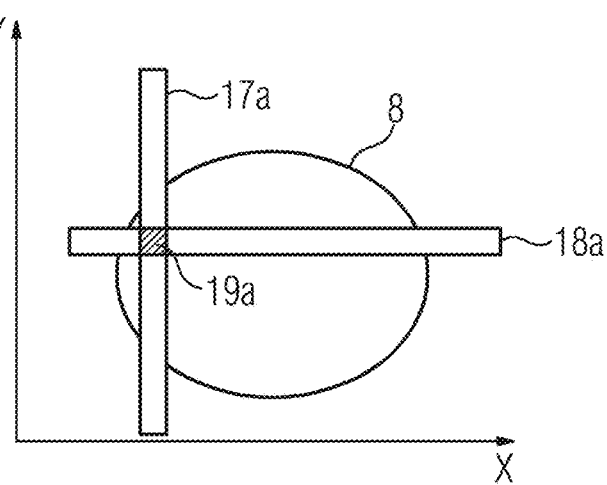
FIG. 4 shows schematics of excited slices in a test object in accordance with an embodiment of a method for measuring a gradient field.

The gradient control unit 12 and the transmit control unit 11 activate the gradient coil arrangement 5 or the body coil 4 to first excite a first slice 17a and then a second slice 18a in the object, where the second slice 18a intersects with the first slice 17a in an intersection region 19a, as shown in FIG. 4. In the example of FIG. 4, the first slice is at right angles to the X direction and thereby parallel to the Y-Z plane; the second slice 18a is at right angles to the Y direction and thereby parallel to the X-Z plane. Other orientations are possible, however. For example, embodiments in which the first slice 17a and the second slice 18a are not at right angles to one another may be provided. If the first slice 17a and the second slice 18a are, however, at right angles to one another, then the two slices 17a, 18a intersect with one another in a volume region with the shape of a square or a column with a rectangular or quadratic cross-section, which extends in parallel to the Z direction. The intersection region 19a may correspond to this column or, in forms of embodiment in which a further third slice is excited, which, for example, is at right angles to the first slice 17a and to the second slice 18a, a part of the column.

Figure 3:
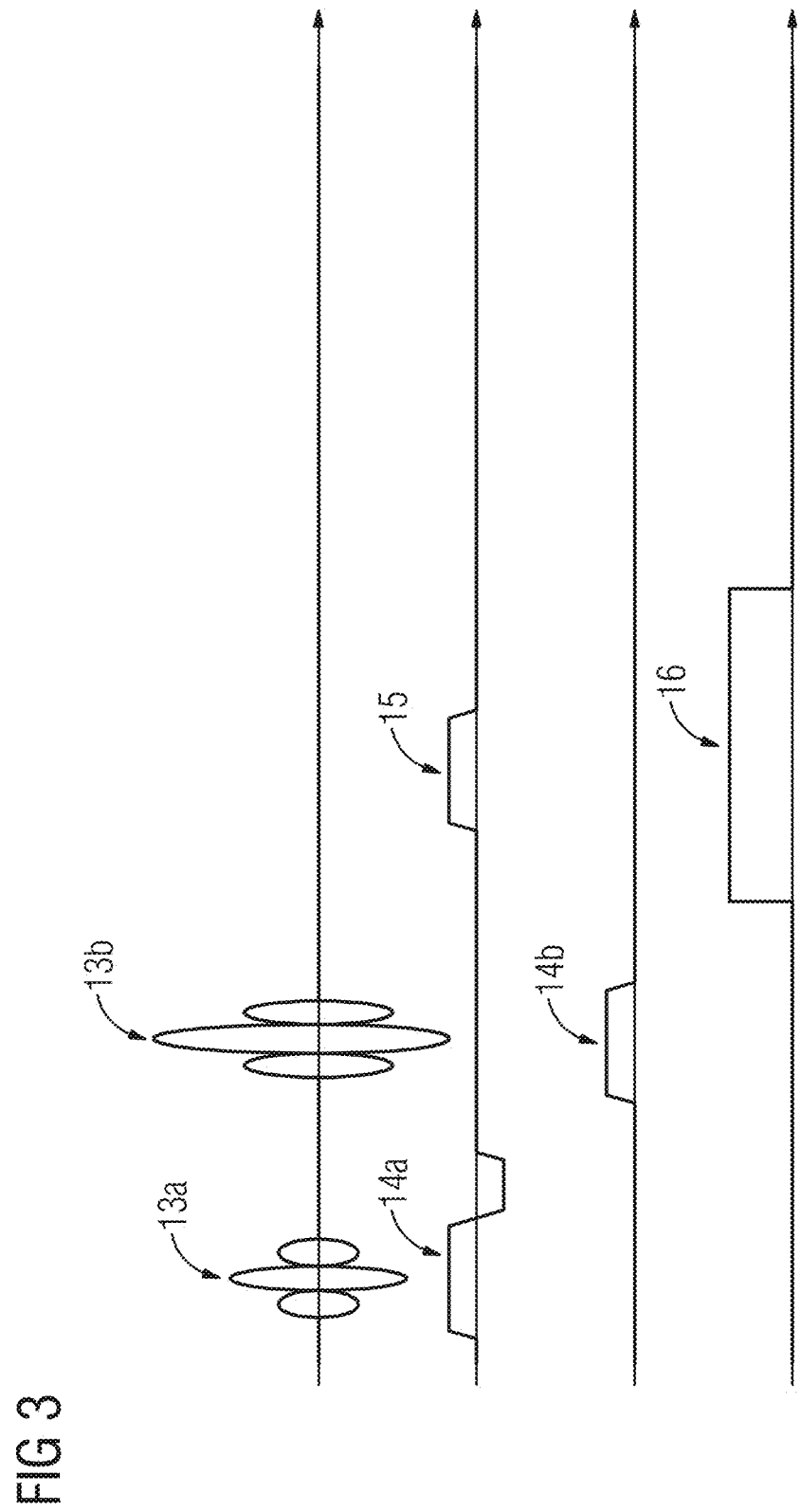
FIG. 3 shows schematically an example of a magnetic resonance (MR) pulse diagram in accordance with an embodiment of a method for measuring a gradient field.

To excite the first slice 17a, the transmit control unit 11 may, for example, activate the body coil 4 to emit a first RF pulse 13a (e.g., an excitation pulse with a flip angle of 90°), and the gradient control unit 12 may activate the gradient coil arrangement 5, essentially at the same time, to switch a first slice selection gradient 14a, as is shown schematically in the pulse diagram of FIG. 3. In the present example, the first slice selection gradient 14a is switched in the X direction. For excitation of the second slice 18a, the transmit control unit 11 may then activate the body coil 4 to emit a second RF pulse 13b (e.g., a refocusing pulse with a flip angle of 180°), and the gradient control unit 12 may activate the gradient coil arrangement 5, essentially at the same time as this, to switch a second slice selection gradient 14b, as is likewise shown in FIG. 3. In the present example, the second slice selection gradient 14b is switched in the Y direction.

After the excitation of the first slice 17a and the second slice, the gradient control unit 12 activates the gradient coil arrangement 5 to switch a readout gradient 15 (e.g., in the X direction) in order to detect an MR signal of a spin echo from the first intersection region 19a. To this end, the ADC of the receive control unit 10 is activated in a readout window 16. In terms of time, the readout gradient 15 may, for example, lie within the readout window 16 or come before the window. The readout gradient 15 shown may also be only partly output during the readout window ADC or lie before this, in order to investigate the disruption effects existing after a gradient pulse.

Then, based on the MR signal or correspondingly created MR data, the computing unit 9 may compute a disruption variable that determines a deviation of a temporal course of an amplitude of the readout gradient 15 from a predetermined required course.

Figure 2:
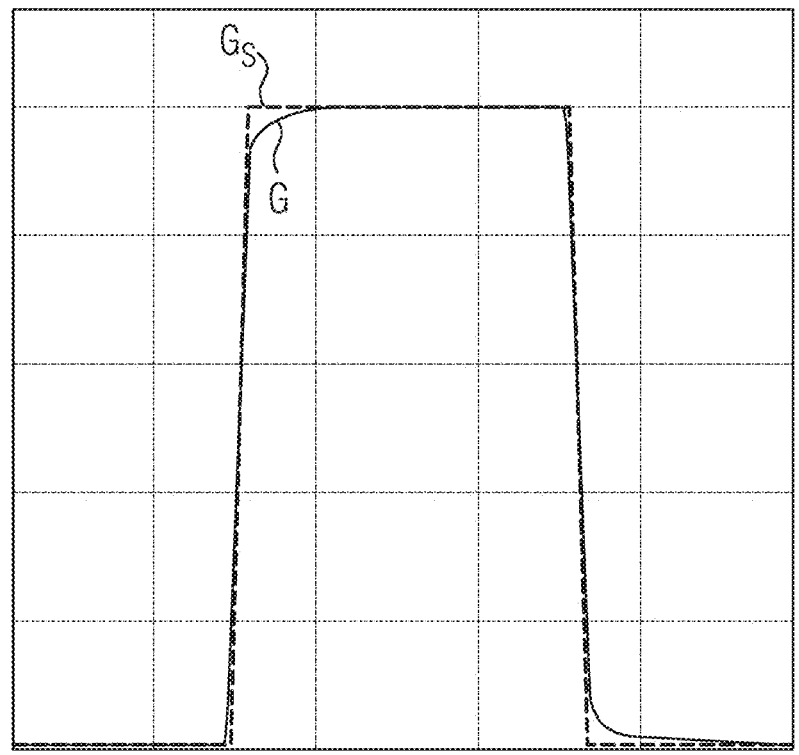
FIG. 2 shows a temporal course of an amplitude of a gradient as well as a corresponding required course.

Shown schematically in FIG. 2 as curve G is the temporal course of the readout gradient 15 and the corresponding required course as curve $G_s$. In general, the relationship between G and $G_s$ may be expressed as follows $$G(t) = G_s(t) - \frac{dG_s(t)}{dt} * e(t), \quad (3)$$

where e(t) refers to the disruption variable, and the operator * represents a convolution. The disruption variable itself may be expressed as follows $$e(t) = \Sigma_{i=1}^{N} A_i e^{-t/\tau_i}. \quad (4)$$

In this equation, $A_i$ refers to the amplitudes, and $\tau_i$ refers to the time constant of the individual disruption amounts (e.g., eddy current amounts). Different methods may be used for determination of the amplitudes and time constants.

Figure 5:
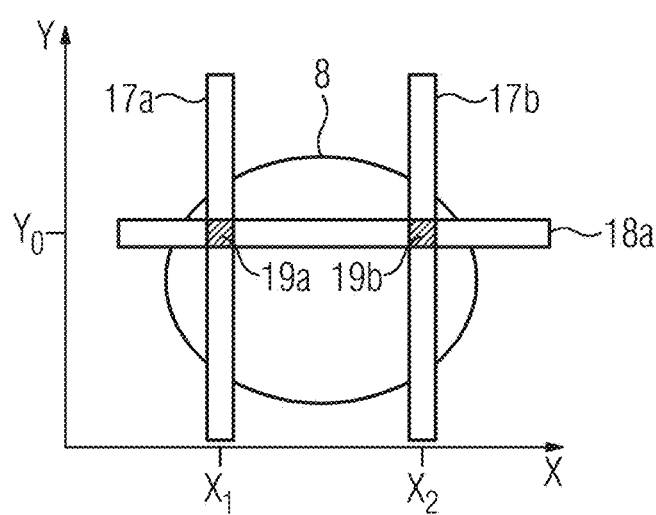
FIG. 5 shows schematics of excited slices in a test object in accordance with a an embodiment of a method for measuring a gradient field.

In order to determine the amplitudes and time constants, as well as the measurement at the first intersection region 19a described above with regard to FIG. 3 and FIG. 4, for example, a measurement may be carried out at at least one further position, as is shown in FIG. 5 by way of example.

For this, in a similar way to that described above, for example, a further first slice 17b is excited, which, for example, is parallel to the first slice 17a. For example, the first slice 17a may be centered at an X position X1, and the further first slice 17b may be centered at an X position X2. Then, the second slice 18a is excited once again, so that the further first slice 17b and the second slice 18a intersect in a second intersection region 19b. The readout gradient 15 is then switched once again in order to measure a further MR signal from the second intersection region 19b.

Figure 6:
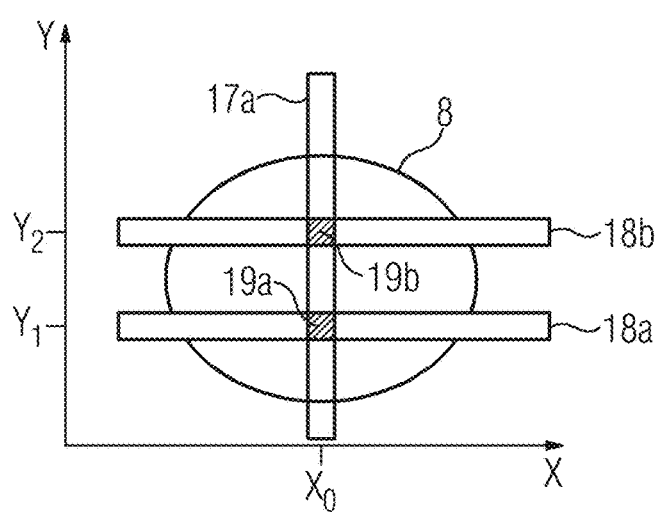
FIG. 6 shows schematics of excited slices in a test object in accordance with an embodiment of a method for measuring a gradient field.

As an alternative, as shown in FIG. 6, the first slice 17a is excited once again, and thereafter, a further second slice 18b, which, for example, is parallel to the second slice 18a, is excited. For example, the second slice 18a may be centered at a Y position Y1, and the further second slice 18b may be centered at a Y position Y2. The first slice 17a and the further second slice 18b may then intersect in the second intersection region 19b. The readout gradient 15 may be switched once again in order to measure a further MR signal from the second intersection region 19b.

Then, from the MR signal and the further MR signal, a phase difference 4(t) may be determined, and from a first temporal derivation of the MR signal and the further MR signal, the gradient trajectory G(t) may be determined $$G(t) = \frac{1}{2\pi d\gamma} \frac{d\phi}{dt}, \quad (5)$$

where γ is the gyromagnetic ratio, and d in the example of FIG. 5 corresponds to the distance X2-X1 of the first slice 17a from the further first slice 17b, and in the example of FIG. 6 corresponds to the distance Y2-Y1 of the second slice 18a from the further second slice 18b.

By a fit of the measured values in accordance with equation (5) to the relationship of the equation (3), the amplitudes and time constants of the disruption variable e(t) may be determined.

Thus, through the method of the present embodiments, the temporal course of gradient fields and field disruptions of higher spatial order may be measured, which, for example, are caused by eddy currents. In this case, too short-term effects (e.g., eddy currents with very short time constants) may be acquired. A particular application purpose is the correction of gradient trajectories during gridding. To this end, disruption of higher spatial order may be approximated locally by gradient-like disruption.

Optionally, additional reference measurements may be carried out, in which measurements are made at the respective slice positions without output of the readout gradients 15. This data from the reference measurements may, for example, be subtracted from the data of the measurement with the readout gradients 15 (e.g., sample by sample) in order not to suppress effects in focus such as drift effects of the B0-field or influences of concomitant fields. Further, to increase the signal-to-noise ratio, a specific number of repetitions of the otherwise same measurements may be output. After this, the corresponding data is then averaged.

The axes shown, for example, in FIG. 4, FIG. 5, and FIG. 6 are examples; other possible combinations are likewise possible. It is likewise possible to use yet further gradient pulses (e.g., for spoiling of unwanted signals, such as for suppression of signals resulting from Free Induction Decay (FID)).

For a development of the method, a pulse diagram is shown in FIG. 7. By comparison with the method explained with regard to FIG. 3, at least one third RF pulse 13c with a simultaneous third slice selection gradient 14c is used, where, for example, all slice selection gradients 14a, 14b, 14c used point in different directions, (e.g., orthogonal to one another).

The method with two RF pulses 13a, 13b utilizes the spin echo arising; the method with three RF pulses 13a, 13b, 13c utilizes the stimulated echo arising. While the flip angle of the second RF pulse 13b in the first case, for example, is equal to 180° and those of the first RF pulses 13a are equal to 90°, in order to create a maximum spin echo, in the second case, the flip angle of all three RF pulses 13a, 13b, 13c is, for example, equal to 90°, in order to create a maximum stimulated echo.

Through the intersecting excited slices (e.g., orthogonal to one another), the created MR signal originates from their intersection region 19a, 19b. In the method with only two RF pulses 13a, 13b, the signal originates from a column that is not restricted in the third coordinate. The edge lengths of the restricted sides of the column are given by the slice thicknesses that result from the two RF pulses 13a, 13b. In the method with three RF pulses 13a, 13b, 13c, the signal originates from a voxel, of which the edge lengths are given by the thicknesses of the slices excited by the three RF pulses 13a, 13b, 13c.

As in the method with two RF pulses 13a, 13b, it is also possible in the method with three RF pulses 13a, 13b, 13c to use further gradient pulses for spoiling of unwanted signals, for example, to suppress an FID signal. In the method with three RF pulses 13a, 13b, 13c, the spin echo signal may, if necessary, also be suppressed by spoiling.

In both cases, particular measurements are carried out at different positions, so that the intersection region 19a, 19b from which the signal originates lies at different locations. The choice of slice position is determined, for example, by the frequency of the corresponding RF pulses. For example, measurements are carried out at two positions. For the measurement of the temporal course of the readout gradients 15, of an X gradient, for example, the intersection regions 19a, 19b are offset in the respective direction (e.g., in the X direction), as shown in FIG. 5. As a variation, it is also possible to carry out the measurement at more than two positions (e.g., in the X direction) and then divide up the measured field effects into linear and higher orders.

Unlike known methods, the present embodiments thus offer the option of measuring the temporal course of a gradient in one direction with a fixed other coordinate (e.g., in the case of FIG. 5 with Y0). This is, for example, advantageous when field disruptions of higher order that may be approximated locally by a gradient-like disruption are present.

Further, forms of embodiment offer the option of determining the dynamics of the created fields in a direction other than that of the gradients creating the fields, as shown in FIG. 7. From the measurements at the two intersection areas 19a, 19b, the cross term of the X-gradient may be determined in the Y direction, for example (e.g., the dynamic field course in the Y direction, which is created by the X gradient). In one embodiment, it is also possible to carry out these measurements at a number of X or further Y positions in order to divide up the measured field courses into linear cross terms and field courses of a higher spatial order.

By application of the method with three RF pulses 13a, 13b, 13c, the previously described spatial limitation for examination of a gradient may be limited in a further coordinate. For example, it is possible in such forms of embodiment to determine the course and the disruption effects of an X gradient at positions Y0 and Z0 when the axes of the slice selection gradient 14a, 14b, 14c are chosen accordingly.

The method with three RF pulses 13a, 13b, 13c is also suitable for determining dynamic field distributions of a higher spatial order. In this case, measurements may be carried out at different voxels, and from the measured phase courses, the spatial distribution of the field effects of a gradient output on an axis may be measured. Thereby, three-dimensional field distributions, and thus also eddy currents of a higher spatial order may be determined. An analysis of the field distributions of higher spatial orders may be undertaken, for example, based on the development of the measured fields in spherical harmonics, which represent a set of orthonormal basic functions. It is thus possible, for example, from measurements at nine different positions, to determine field distributions of a higher spatial order up to the second order. With measurements at 16 positions, it is possible to determine distributions up to the third order and so forth.

The method of the present embodiments may be carried out in different forms of embodiment in the calibration of the MRT system 1 (e.g., as part of a tune-up process). The information and data determined (e.g., the disruption variable e(t)) may then be used for imaging measurements or for their reconstruction. As an alternative or in addition, it is also possible to carry out forms of embodiment of the method in each case directly before an imaging measurement with the respective patient. Then, further parameters are also known, such as the positioning of the slices to be measured. Therefore, the calibration measurement may then be aligned so that, for example, the gradient course of a readout gradient may be measured directly at the position of a slice to be measured.

The information and data obtained by the described method are able to be used in a variety of ways. By way of example, gridding should be mentioned. The measured gradient course may be used to correct the measured data in the k-space. In corresponding forms of embodiment, the gradient course may be measured at positions that are restricted in one or two coordinates. This enables the gridding correction to be carried out depending on the location (e.g., aligned to the measured slice in each case). With transversal slices (e.g., with slice selection in the Z direction) with readout gradients in the X direction, the actual X gradient may be measured as function of the Z position. This then enables the gridding correction to be carried out as a function of the slice. Likewise, a gridding correction may also be carried out in directions other than the readout direction (e.g., in the phase encoding or slice selection direction).

In other application cases, a slice-dependent and/or position-dependent eddy current correction may be carried out. The parameters of the eddy current correction by pre-emphasis may also be chosen using the disruption variable determined depending on slice and/or depending on position.

In general, forms of embodiment may be utilized for determination of eddy currents of a higher order and of cross terms, where shortest time constants may also be measured. The cross terms determined may then also be applied by pre-emphasis, for example. The data may also be used for further image corrections (e.g., for phase corrections in EPI measurements).

Different forms of embodiment enable measurement time to be saved where necessary, since no complete segmentation is needed. For example, only measurements at the relevant positions may be carried out (e.g., at 16 voxels for a three-dimensional determination of the field courses in third spatial order). The measurements are also able to be integrated in different forms of embodiment as navigator or pre-scan measurements into imaging sequences. Further, forms of embodiment of do not require any additional sensor systems, such as field probes or the like.

While the present disclosure has been described in detail with reference to certain embodiments, the present disclosure is not limited to those embodiments. In view of the present disclosure, many modifications and variations would present themselves, to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within the scope.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for measuring a gradient field in an imaging region of a magnetic resonance tomography (MRT) system, the method comprising:
    exciting a first slice in a test object that is located in the imaging region;
    after the exciting of the first slice, exciting a second slice in the test object, wherein the second slice intersects with the first slice in an intersection region;
    after the exciting of the second slice, switching a readout gradient and acquiring a magnetic resonance (MR) signal emitted from the intersection region;
    after the exciting of the second slice and before the switching of the readout gradient, exciting a third slice in the test object, wherein the third slice, the second slice, and the first slice intersect with one another in the intersection region; and
    depending on the MR signal, computing a disruption variable that determines a deviation of a temporal course of an amplitude of the readout gradient from a predetermined required course for the readout gradient.

2. The method of claim 1, wherein the disruption variable is computed as a variable independent of the predetermined required course.

3. The method of claim 1, wherein exciting the first slice comprises exciting the first slice by a first radio frequency (RF) pulse being emitted into the imaging region and a first slice selection gradient being switched at least partly at a same time as the first RF pulse, and
    wherein a first flip angle resulting from the first RF pulse lies between 60° and 120°, lies between 80° and 100°, or is equal to 90°.

4. The method of claim 3, further comprising:
    exciting a further first slice in the test object;
    after the exciting of the further first slice, exciting a further second slice in the test object, wherein the further second slice intersects with the further first slice in a further intersection region;

after the exciting of the further second slice, depending on the predetermined required course, switching a further readout gradient, and acquiring a further MR signal emitted from the further intersection region, wherein computing the disruption variable comprises computing the disruption variable depending on the MR signal and the further MR signal.

5. The method of claim 4, wherein the disruption variable is computed depending on a phase difference between the MR signal and the further MR signal.

6. The method of claim 5, wherein the disruption variable is computed as a time-dependent function e(t) based on the relationship $$\dot{\phi}(t)/(2\pi d\gamma) = G_s(t) - \int_0^t e(\tau)\hat{G}_s(\tau)d\tau$$

wherein t refers to a time, $G_s$ refers to the predetermined required course, $\dot{G}_s$ refers to a first temporal derivation of the predetermined required course, $\dot{\phi}$ refers to a first temporal derivation of the phase difference, $\gamma$ refers to a gyromagnetic ratio, and d refers to a spatial distance between the intersection region and the further intersection region.

7. The method of claim 6, wherein an approach is chosen for the disruption variable in accordance with which the disruption variable is defined by a plurality of parameters independent of one another, and respective values for the plurality of parameters independent of one another are computed by a fit method.

8. The method of claim 4, wherein the further first slice is equal to the first slice, and the further second slice is parallel to the second slice; or
wherein the further second slice is equal to the second slice, and the further first slice is parallel to the first slice.

9. The method of claim 1, wherein the third slice is at right angles to the first slice and at right angles to the second slice.

10. The method of claim 1, wherein exciting the second slice comprises exciting the second slice by a second RF pulse being emitted into the imaging region and by a second slice selection gradient being switched at least partly at a same time as the second RF pulse,
wherein a second flip angle resulting from the second RF pulse lies between 60° and 120°, lies between 80° and 100°, or is equal to 90°,
wherein exciting the third slice comprises exciting the third slice by a third RF pulse being emitted into the imaging region and by a third slice selection gradient being switched at least partly at a same time as the third RF pulse, and
wherein a third flip angle resulting from the third RF pulse lies between 60° and 120°, lies between 80° and 100°, or is equal to 90°.

11. The method of claim 3, wherein exciting the second slice comprises exciting the second slice by a second RF pulse being emitted into the imaging region and by a second slice selection gradient being switched at least partly at a same time as the second RF pulse, and
wherein a second flip angle resulting from the second RF pulse lies between 150° and 210°, lies between 170° and 190°, or is equal to 180°.

12. A method for magnetic resonance tomography (MRT) using an MRT system, the method comprising:
measuring a gradient field in an imaging region of the MRT system, the measuring comprising:
exciting a first slice in a test object that is located in the imaging region;
after the exciting of the first slice, exciting a second slice in the test object, wherein the second slice intersects with the first slice in an intersection region;
after the exciting of the second slice, switching a readout gradient and acquiring a magnetic resonance (MR) signal emitted from the intersection region;
after the exciting of the second slice and before the switching of the readout gradient, exciting a third slice in the test object, wherein the third slice, the second slice, and the first slice intersect with one another in the intersection region; and
depending on the MR signal, computing a disruption variable that determines a deviation of a temporal course of an amplitude of the readout gradient from a predetermined required course for the readout gradient; and
creating at least one MR image depending on the disruption variable.

13. The method of claim 12, further comprising:
creating MR data that represents the test object in the imaging region using the MRT system, wherein the at least one MR image is created depending on the MR data and the disruption variable; or
creating MR data is using the MRT system, wherein creating the MR data comprises switching at least one gradient pulse depending on the disruption variable, and wherein the at least one MR image is created depending on the MR data.

14. The method of claim 12, wherein the disruption variable is computed as a variable independent of the predetermined required course.

15. The method of claim 12, wherein exciting the first slice comprises exciting the first slice by a first radio frequency (RF) pulse being emitted into the imaging region and a first slice selection gradient being switched at least partly at a same time as the first RF pulse, and
wherein a first flip angle resulting from the first RF pulse lies between 60° and 120°, lies between 80° and 100°, or is equal to 90°.

16. The method of claim 15, wherein the measuring further comprises:
exciting a further first slice in the test object;
after the exciting of the further first slice, exciting a further second slice in the test object, wherein the further second slice intersects with the further first slice in a further intersection region;
after the exciting of the further second slice, depending on the predetermined required course, switching a further readout gradient, and acquiring a further MR signal emitted from the further intersection region,
wherein computing the disruption variable comprises computing the disruption variable depending on the MR signal and the further MR signal.

17. A magnetic resonance tomography (MRT) system having an imaging region, the MRT system comprising:
a radio frequency (RF) transmit coil arrangement and a gradient coil arrangement that surround the imaging region;
a signal acquisition apparatus; and
at least one controller that is configured to:

activate the RF transmit coil arrangement and the gradient coil arrangement, such that a first slice is excited in a test object that is located in the imaging region;

activate the RF transmit coil arrangement and the gradient coil arrangement, such that, after the excitation of the first slice, a second slice is excited in the test object, wherein the second slice intersects with the first slice in an intersection region;

activate the gradient coil arrangement after the excitation of the second slice, such that a readout gradient is switched;

activate the RF transmit coil arrangement and the gradient coil arrangement, such that, after the excitation of the second slice and before the switch of the readout gradient, a third slice is excited in the test object, wherein the third slice, the second slice, and the first slice intersect with one another in the intersection region; and activate the signal acquisition apparatus, such that a magnetic resonance (MR) signal emitted from the intersection region is acquired; and a computing unit that is configured, depending on the MR signal, to compute a disruption variable that determines a deviation of a temporal course of an amplitude of the readout gradient from a predetermined required course.

* * * * *